(12) United States Patent
Kuan et al.

(10) Patent No.: US 12,444,633 B2
(45) Date of Patent: Oct. 14, 2025

(54) WORKPIECE HANDLING SYSTEM, METHOD OF CALIBRATING WORKPIECE HANDLING SYSTEM AND METHOD OF MANUFACTURING SEMICONDUCTOR PACKAGE

(71) Applicant: Taiwan Semiconductor Manufacturing Company, Ltd., Hsinchu (TW)

(72) Inventors: Ta-Meng Kuan, Taoyuan (TW); Yi-Neng Chang, Hsinchu County (TW); Ting-Yu Chiu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1081 days.

(21) Appl. No.: 17/460,341

(22) Filed: Aug. 30, 2021

(65) Prior Publication Data
US 2023/0065638 A1    Mar. 2, 2023

(51) Int. Cl.
*H01L 21/677* (2006.01)
*H01L 21/68* (2006.01)
*H01L 21/687* (2006.01)

(52) U.S. Cl.
CPC .. *H01L 21/67766* (2013.01); *H01L 21/67745* (2013.01); *H01L 21/681* (2013.01); *H01L 21/68707* (2013.01)

(58) Field of Classification Search
CPC ......... H01L 21/67766; H01L 21/67745; H01L 21/681; H01L 21/68707; H01L 21/67144; H01L 21/67242; H01L 21/67703; H01L 21/68
See application file for complete search history.

(56) References Cited

U.S. PATENT DOCUMENTS

| | | | | |
|---|---|---|---|---|
| 5,290,134 A * | 3/1994 | Baba | ................. | G01R 31/2851 414/754 |
| 6,563,904 B2 * | 5/2003 | Wijts | ................. | A22C 17/0086 83/72 |
| 7,842,912 B2 * | 11/2010 | Ding | ................. | H04N 17/002 348/95 |
| 8,106,349 B2 * | 1/2012 | Ding | ................. | G01R 31/2891 702/94 |
| 9,363,936 B2 * | 6/2016 | Kodama | ............ | H05K 13/0882 |
| 11,987,450 B2 * | 5/2024 | Yamada | ............. | G05B 19/4189 |
| 2002/0067797 A1 * | 6/2002 | Safai | ................. | A22C 17/10 378/54 |
| 2002/0103571 A1 * | 8/2002 | Yoo | ................. | H01L 21/67796 700/228 |

(Continued)

*Primary Examiner* — Michael Collins
(74) *Attorney, Agent, or Firm* — JCIPRNET

(57) ABSTRACT

A workpiece handling system includes a carrier, a lower imaging device, and a transfer mechanism. The carrier is configured to carry at least one workpiece. The lower imaging device is disposed beside the carrier. The transfer mechanism is movably disposed over the lower imaging device and the carrier, wherein the transfer mechanism includes an end effector configured to pick and place the at least one workpiece and an upper imaging device disposed beside the end effector. A method of calibrating a workpiece handling system and a method of manufacturing a semiconductor package are also provided.

20 Claims, 8 Drawing Sheets

(56) References Cited

U.S. PATENT DOCUMENTS

| | | | |
|---|---|---|---|
| 2007/0185676 A1* | 8/2007 | Ding | G01R 31/2891 |
| | | | 702/94 |
| 2010/0017161 A1* | 1/2010 | Ding | G01R 31/2891 |
| | | | 702/94 |
| 2017/0194187 A1* | 7/2017 | Xu | H01L 21/67778 |
| 2017/0365501 A1* | 12/2017 | Ng | H01L 21/6838 |
| 2020/0227319 A1* | 7/2020 | Yamamoto | H01L 21/67132 |

* cited by examiner

WORKPIECE HANDLING SYSTEM, METHOD OF CALIBRATING WORKPIECE HANDLING SYSTEM AND METHOD OF MANUFACTURING SEMICONDUCTOR PACKAGE

BACKGROUND

Modern manufacturing processes are typically highly automated to manipulate materials and devices and create a finished product. Quality control, alignment, calibration, and maintenance processes often rely on human skill, knowledge and expertise for inspection of the manufactured product both during manufacture and as a finished product.

BRIEF DESCRIPTION OF THE DRAWINGS

Aspects of the present disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
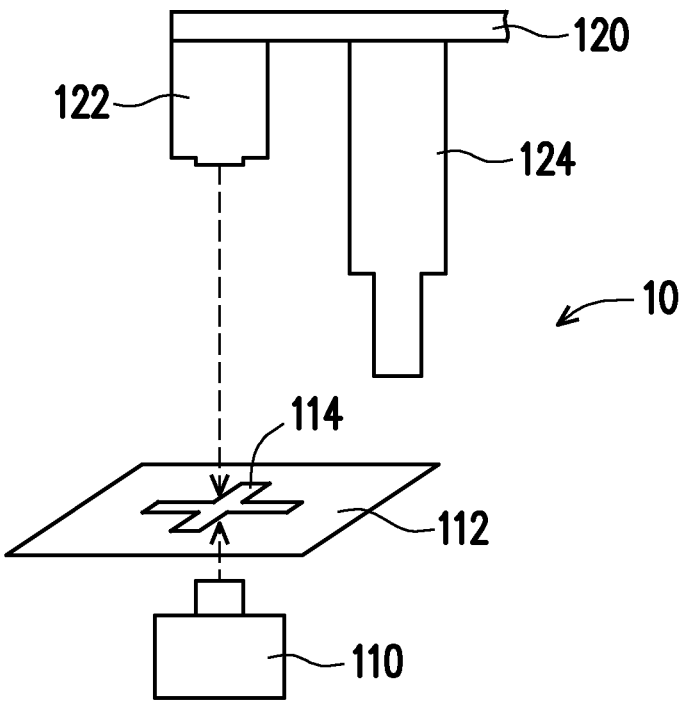
FIG. 1 to FIG. 3 illustrate schematic side views of a workpiece handling system in different operation scenarios according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A workpiece handling system, a method of calibrating the workpiece handling system and a method of manufacturing semiconductor package with the workpiece handling system are provided in accordance with various exemplary embodiments. Before addressing the illustrated embodiments specifically, certain advantageous features and aspects of the present disclosed embodiments will be addressed generally. The workpiece handling system may be adopted for aligning and calibrating each of the devices in the workpiece handling system before or during the manufacturing process performed on at least one workpiece. Described below is a workpiece handling system having a lower imaging device disposed under a transfer mechanism configured to pick and place the workpiece. Correspondingly, an upper imaging device is disposed on the transfer mechanism with respect to the lower imaging device. Accordingly, the upper imaging device, the lower imaging device can be aligned with one another for initial calibration, and offsets of the carrier and an end effector of the transfer mechanism can be calibrated during the performance of the manufacturing process. Thereby, the alignment and calibration of the workpiece handling system can be performed automatically rather than manually, and work force and labor cost can be saved significantly. The intermediate stages of forming the semiconductor package incorporating the calibration process are illustrated in accordance with some embodiments. Some variations of some embodiments are discussed. Throughout the various views and illustrative embodiments, like reference numbers are used to designate like elements.

Figure 2:
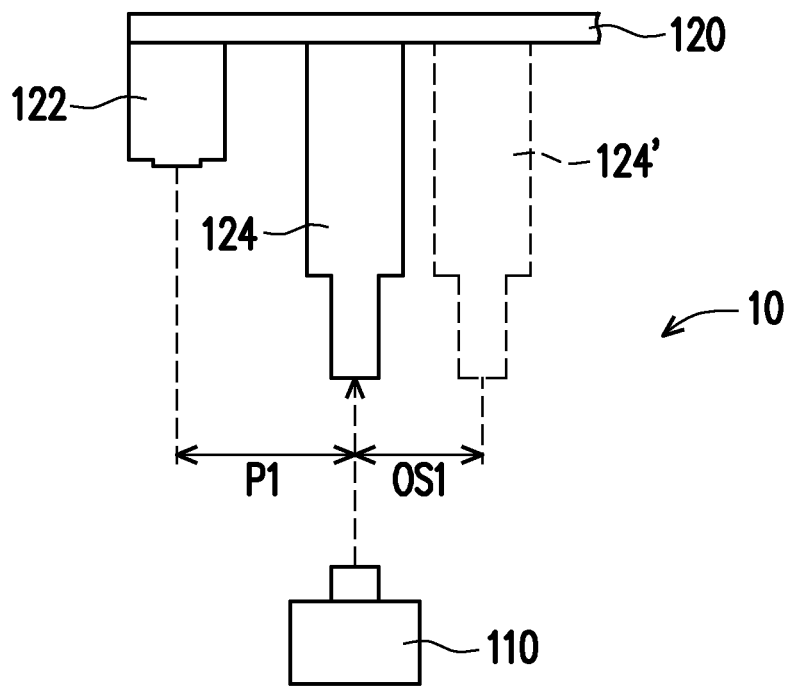
Figure 3:
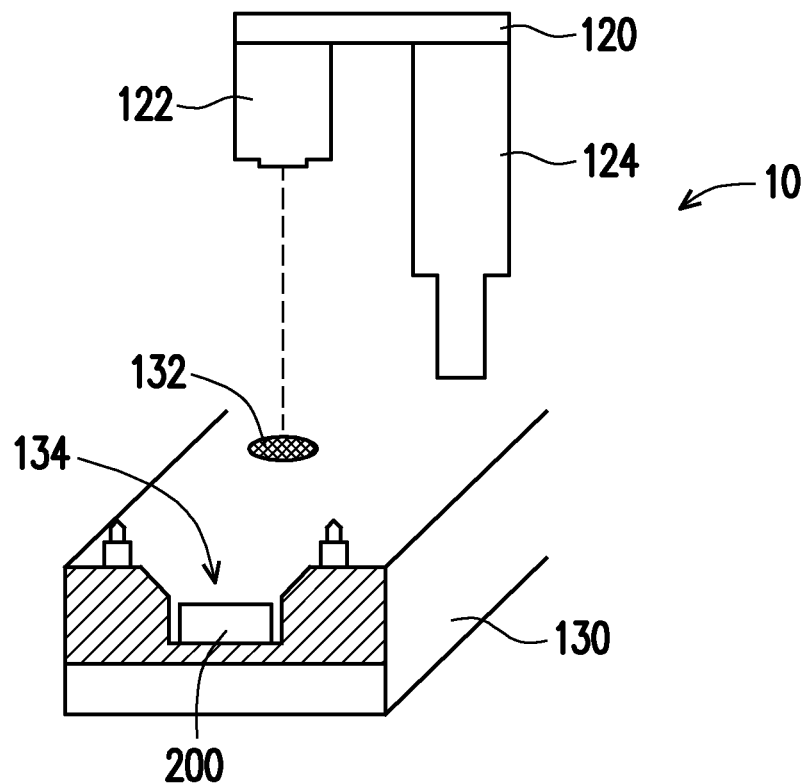

FIG. 1 to FIG. 3 illustrate schematic side views of a workpiece handling system in different operation scenarios according to some embodiments of the present disclosure. Referring to FIG. 1 to FIG. 3, in some embodiments, a workpiece handling system 10 may include a lower imaging device 110, a transfer mechanism 120 configured to pick and place at least one workpiece to be processed and a carrier 130 for carrying the at least one workpiece. It is noted that the term "workpiece" as used herein can encompass a whole wafer, a partial wafer (e.g., a die), a package, or other types of whole or partial objects or components having one or more planar surface areas upon which a set of inspection processes, testing processes and/or other processing operations may be performed. The term "carrier" in the description that follows generally refers to a support member, a tray or frame configured for carrying or supporting a workpiece, for instance, and to which a workpiece is mounted or adhered, in a manner understood by one of ordinary skill in the relevant art.

In accordance with some embodiments of the disclosure, the transfer mechanism 120 may be a pick and place apparatus. The transfer mechanism 120 includes one or more end effector 124 configured to pick up one or more workpiece 200 from component feeders (e.g., a carrier) and moves in x, y and z directions to place the workpiece 200 in the proper orientation at the proper location upon the workpiece 200 to be placed or mounted (e.g., another carrier). In some embodiments, the transfer mechanism 120 may further include a sensor (not shown) that may pass under the workpiece 200 held by the end effector 124 as the transfer mechanism 120 moves the workpiece 200 from pickup locations to placement locations (i.e. locations of the carrier). Sensor allows the transfer mechanism 120 to view undersides of the workpiece 200 held by the end effector 124 such that the workpiece orientation and, to some degree, workpiece testing and/or inspection can be effected while the workpiece 200 is being moved from the workpiece pick-up location to the placement location. Other pick and place machines may employ a placement head that moves over a stationary camera to image the component.

In some embodiments, the workpiece handling system 10 may further include a controller (not shown) coupled to the lower imaging device 110, the transfer mechanism 120, and the carrier 130 for managing or controlling aspects of system operation (e.g., by way of the execution of stored program instructions). The controller may include a computer system or computing device, which includes a processor (e.g., a microprocessor or microcontroller, or the like), a memory (e.g., fixed and/or removable random access memory (RAM), read-only memory (ROM), or the like), communication resources (e.g., standard signal transfer and/or network interfaces, or the like), data storage resources (e.g., a hard disk drive, an optical disk drive, or the like), and a display device (e.g., a flat panel display screen, or the like).

The transfer mechanism 120 may include a robotic arm in accordance with some embodiments. As introduced above, the robotic arm may be a programmable mechanical arm to grasp, hold, and manipulate workpieces. The robotic arm may include a base, at least one link, and the end effector 124. For purpose of brevity and to aid understanding, the term "end effector" as used herein may be any type of end effector used for grasping or holding a workpiece. In the present embodiment, the end effector 124 is a nozzle, which grabs a workpiece by suction force. However, in alternative embodiments, other end effector may be adopted, such as a pressure end effector (e.g., gripping by applying pressure to a workpiece, such as with a pincer type motion), an area end effector (e.g., gripping by surrounding a workpiece to be manipulated), and a magnetic end effector (e.g., gripping by use of electromagnetic forces). The disclosure is not limited thereto. The end effector 124 may be mounted on a robotic arm with at least one degree of freedom (e.g., three degrees of freedom) that connects the end effector 124 to a base. For example, the end effector 124 may be a nozzle that applies vacuum force selectively to retrieve, hold, and place a workpiece such as a die during transport by the transfer mechanism 120 (e.g., as a pick and place head vacuum holder).

Figure 4:
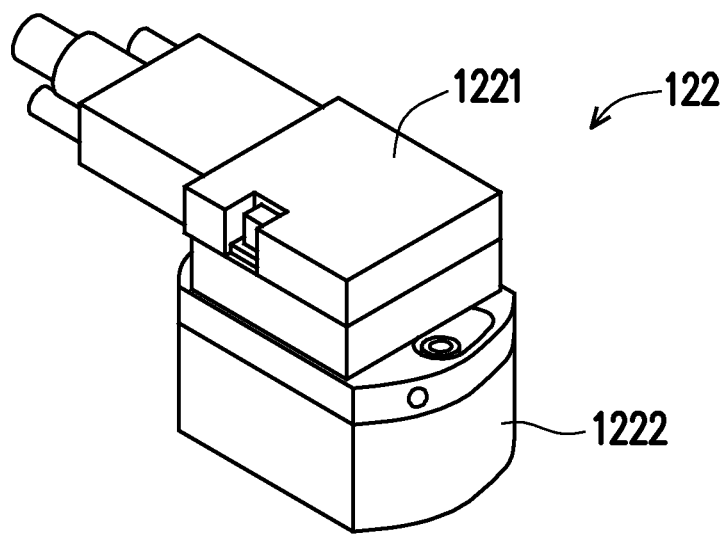
FIG. 4 illustrates a schematic view of an upper imaging device of a workpiece handling system according to some embodiments of the present disclosure.

FIG. 4 illustrates a schematic view of an upper imaging device of a workpiece handling system according to some embodiments of the present disclosure. With now reference to FIG. 1 and FIG. 4, in some embodiments, the transfer mechanism 120 may further include an upper imaging device 122, which may be a downwardly-looking camera. In some embodiments, the upper imaging device 122 is disposed beside the end effector 124 as it is shown in FIG. 1. That is, the upper imaging device 122 and the end effector 124 are disposed on the transfer mechanism 120 in a side-by-side manner. In accordance with some embodiments of the disclosure, the upper imaging device 122 may include a photo detector 1221, such as, but not limited to, charge coupled devices (CCDs), diode arrays, photomultiplier tube arrays, charge injection devices (CIDs), CMOS detectors, and avalanche photodiodes. In some embodiments, the photo detector 1221 can be a mono or color sensor. In some embodiments, the photo detector 1221 can be configured to either work in a broad range of wavelengths or a narrow range of wavelengths. In some embodiments, the upper imaging device 122 may further include a light source 1222, which outputs light downwardly. In some other embodiments, the photo detector 1221 can be configured to receive either reflected and/or scattered non-fluorescence light from a light source or a fluorescence light emitted by the defects or features due to an excitation by the light source 1222. For example, the light source 1222 emits light toward a target, for example, an alignment mark 114 on the lower imaging device 110, and the light strikes the alignment mark 114 and is reflected back into the upper imaging device 122. Accordingly, the upper imaging device 122 is configured to locate alignment marks upon the workpiece 200, the lower imaging device 110, and the carrier 130, such that the relative location of transfer mechanism 120 with respect to the workpiece 200, the lower imaging device 110, and the carrier 130 can be readily calculated.

Figure 9:
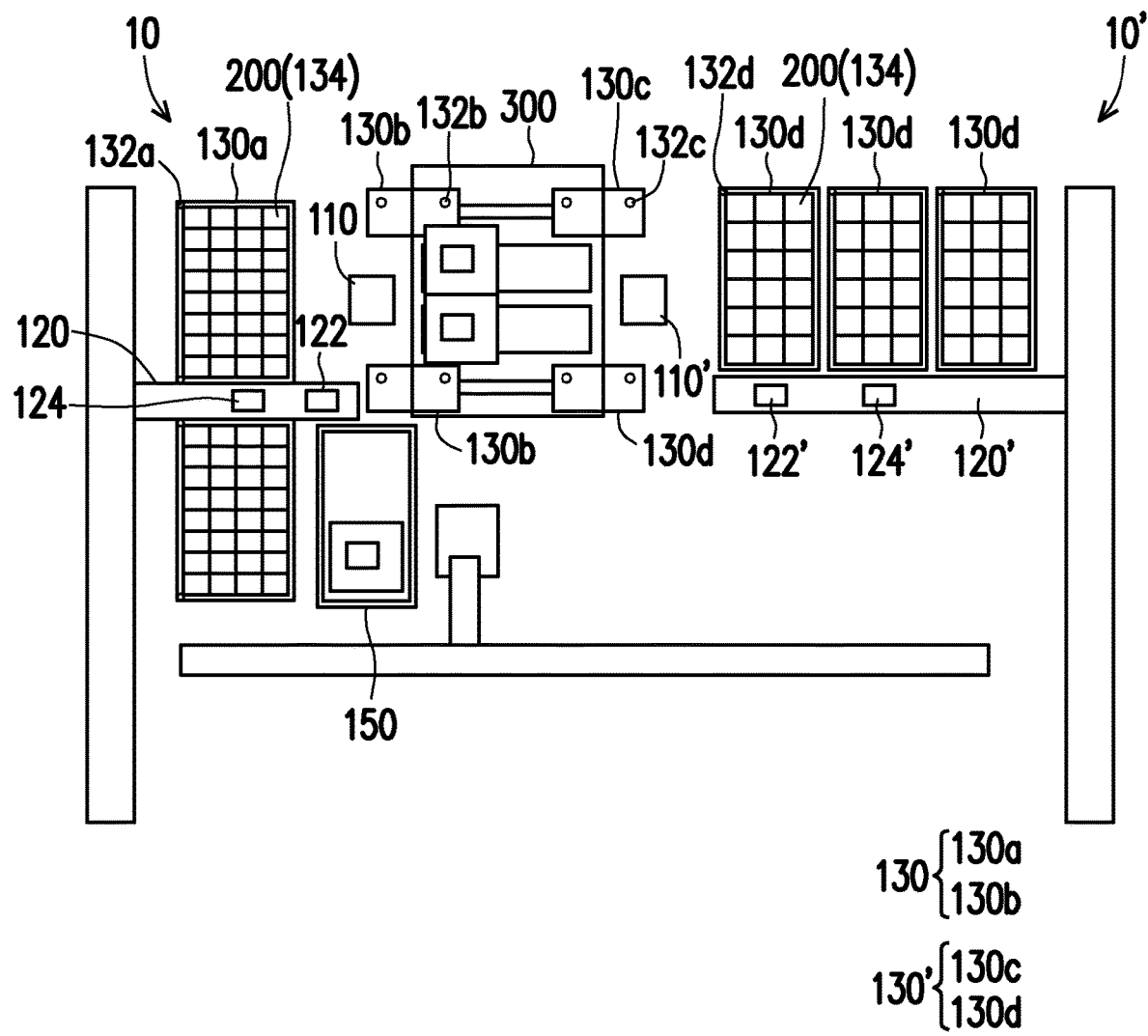
FIG. 9 illustrates a schematic plane view of a workpiece handling system according to some embodiments of the present disclosure.

In some embodiments, the lower imaging device 110 is disposed under the transfer mechanism 120. In other words, the transfer mechanism 120 is movably disposed over the lower imaging device 110 and the carrier 130. In some implementations, the lower imaging device 110 is fixed to a reference position in the system 10 and the transfer mechanism 120 is moved relatively to the lower imaging device 110 for picking up the workpiece 200 from the carrier 130 and/or placing the workpiece 200 on the carrier 130. In one of the implementations, the lower imaging device 110 is disposed beside the carrier 130 (as illustrated in FIG. 9).

In accordance with some embodiments of the disclosure, the lower the imaging device 110 may include a photo detector 116, such as, but not limited to, charge coupled devices (CCDs), diode arrays, photomultiplier tube arrays, charge injection devices (CIDs), CMOS detectors, and avalanche photodiodes. In some embodiments, the photo detector 116 can be a mono or color sensor. In some embodiments, the photo detector 116 can be configured to either work in a broad range of wavelengths or a narrow range of wavelengths. In some other embodiments, the photo detector 116 can be configured to receive either reflected and/or scattered non-fluorescence light from a light source or a fluorescence light emitted by the defects or features due to an excitation by a light source (e.g., light source 118 shown in FIG. 5 and FIG. 6). In some embodiments, the lower imaging device 110 may further include a calibration plate 112 having a plate alignment mark 114. In some embodiments, the material of the calibration plate 112 may include glass, or other suitable transparent material. Accordingly, for initial calibration, the transfer mechanism 120 is configured to be moved to the top of the lower the imaging device 110 to align the upper imaging device 122 with the plate alignment mark 114 of the lower imaging device 110 to obtain a reference point (e.g., origin point) in the system.

Figure 5:
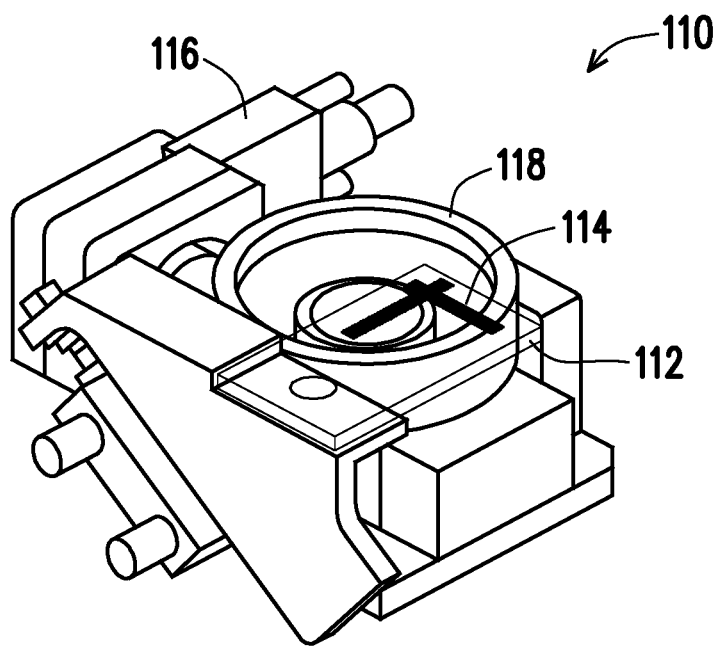
FIG. 5 illustrates a schematic view of a lower imaging device of a workpiece handling system according to some embodiments of the present disclosure.
Figure 6:
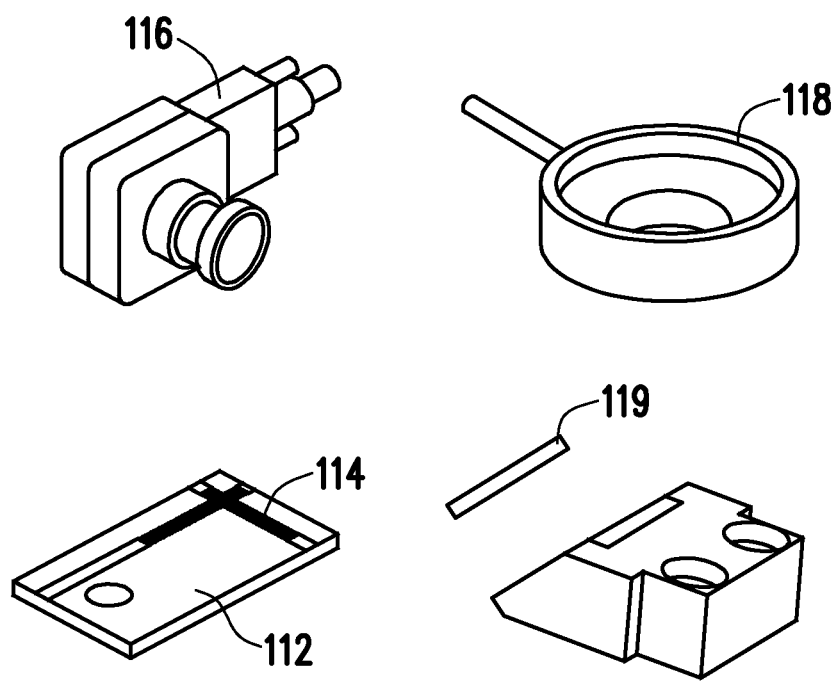
FIG. 6 illustrates a schematic exploded view of the lower imaging device in FIG. 5 according to some embodiments of the present disclosure.

FIG. 5 illustrates a schematic view of a lower imaging device of a workpiece handling system according to some embodiments of the present disclosure. FIG. 6 illustrates a schematic exploded view of the lower imaging device in FIG. 5 according to some embodiments of the present disclosure. With now reference to FIG. 1, FIG. 5 and FIG. 6, in detail, for example, the lower imaging device 110 may further include a light source 118 and a refractor 119. The light source 118 faces the calibration plate 112 and the refractor 119 is disposed on a travel path of the light from the light source 118. Accordingly, the light source 118 outputs light towards the calibration plate 112 and the light may strike the plate alignment mark 114 on the calibration plate 112. At least one of the light is then reflected back to the refractor 119 and is refracted toward the photo detector 116. However, the disclosure is not limited thereto.

With now reference to FIG. 2, after the upper imaging device 122 is aligned with the lower imaging device 110 (e.g., the plate alignment mark 114 on the calibration plate 112), the reference point for the system is set. Then, the transfer mechanism 120 controlled by the controller may then be moved to align the end effector 124 with the lower imaging device 110 to obtain an end effector offset according to the reference point for end effector calibration. For example, the lower imaging device 110 may capture an image of the end effector 124. In some embodiments, the image may be a digitized image of a center (opening) of the end effector 124. The image is obtained by radiating or scanning the transfer mechanism 120 with the light source 118 and determining an image (e.g., based on reflection of the radiation). The scan may include an optical scan of an optically readable target (e.g. central opening) on the end effector 124. The image of the end effector 124 provided by the lower imaging device 110 provides data useful to determine an end effector offset OS1 between a target (predetermined) position (illustrate in dotted line) of the end effector 124' and an actual position (illustrated in solid line) of the end effector 124.

In some embodiments, for calibration of the workpiece handling system, a target offset map and an actual offset map may be generated to determine an offset value for each apparatus (e.g., the end effector, the transport mechanism, the carrier, etc.) in the workpiece handling system. A target offset map may be generated when a new system or new apparatus in the system is set up. In this example, the target offset map is generated from target (predetermined) positions of each apparatus in the system. From target offset map, a target patch (distance) and/or target angle from each apparatus to the reference point (e.g., location of the lower imaging device) may be determined based on the target position of each apparatus.

The actual map may be generated from the actual positions of each apparatus (e.g., the end effector, the transport mechanism, the carrier, etc.) in the workpiece handling system, which is obtained by the imaging devices 110, 122. The imaging devices 110, 122 can form an image of the apparatuses (e.g., the end effector, the carrier, etc.). The image can be processed to derive X, Y, Z movement and/or rotation angle specifications for the apparatuses. From actual offset map, an actual patch (distance) and/or actual angle from each apparatus to the reference point (e.g., location of the upper imaging device 122) may be determined based on the actual position of each apparatus. Once target offset map and actual offset map are generated, an offset compensation algorithm may be performed to determine the offset value for compensating the shifts of the apparatuses in the workpiece handling system.

In detail, in the present embodiment, the end effector offset OS1 is obtained by comparing the target position (illustrate in dotted line) of the end effector 124' from the target offset map and the actual position (illustrated in solid line) of the end effector 124 from the actual offset map with respect to the reference point. For example, to determine whether the end effector 124 is offset (shifted) from the target position, the transfer mechanism 120 is moved to align the end effector 124 with the lower imaging device 110 (e.g., the reference point). Then, calculations and measurements can be made to determine a pitch (e.g., distance) P1 between the end effector 124 at the actual location and the upper imaging device 122 (e.g., the reference point). Then, the end effector offset OS1, if any, may be determined by calculating the difference between the actual position of the end effector 124 and the target position of the end effector 124' with respect to the reference point. The embodiment shown in FIG. 2 illustrates the end effector offset OS1 in, for example, X direction. However, the same method can be used to determine the end effector offset in the Y direction, for example, and/or skew or rotation of the end effector 124 from the target position.

It is noted that a zero end effector offset OS1 means that the actual position of the end effector 124 matches the target position of the end effector 124'. In other words, the center (opening) of the end effector 124 appears to be centered within the target position of the end effector 124'. In the embodiment of FIG. 2, the difference between target position of the end effector 124' and the actual position of the end effector 124 does not substantially equal to zero (e.g., greater than a predetermined value). In other words, the end effector 124 has been shifted from the target position and adjustment is applied to compensate for the shift. The compensation for the shift of the apparatuses (e.g., end effector 124, carrier 130, etc.) would be described later in the disclosure.

Figure 7:
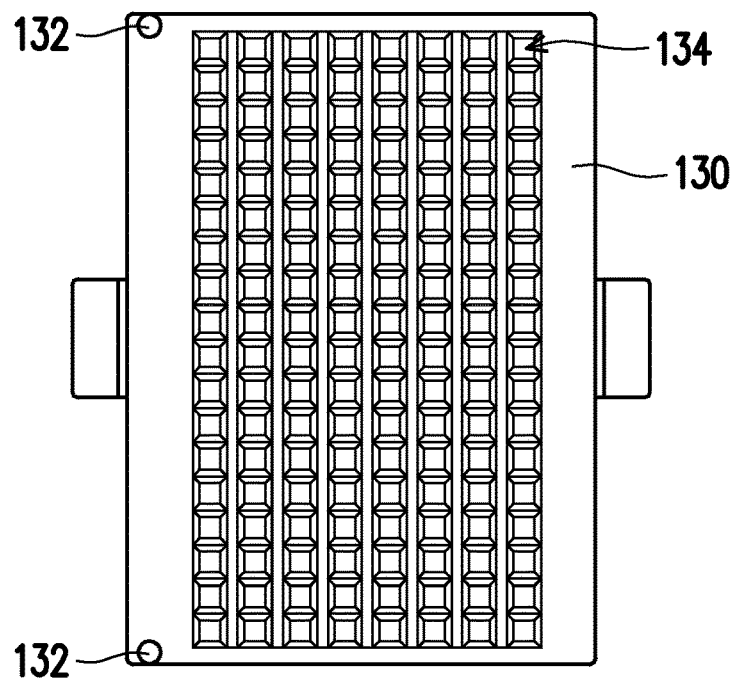
FIG. 7 illustrates a schematic top view of a carrier of a workpiece handling system according to some embodiments of the present disclosure.

FIG. 7 illustrates a schematic top view of a carrier of a workpiece handling system according to some embodiments of the present disclosure. With now reference to FIG. 3 and FIG. 7, in some embodiments, the transfer mechanism 120 controlled by the controller may be moved to align the upper imaging device 122 with the carrier 130 to obtain a carrier offset according to the reference point (e.g., location of the lower imaging device 110). In some embodiments, the carrier 130 has a carrier alignment mark 132, and at least one slot 134 for receiving the at least one workpiece 200. Accordingly, the transfer mechanism 120 is configured to move to align the upper imaging device 122 with the carrier alignment mark 132 for carrier calibration.

To measure the offset between the target position and the actual position, alignment marks are often used. In the present embodiment, the carrier alignment mark 132 are in circular shape. For ease of reference, a representative alignment mark is illustrated in one or more of the accompanying figures. Although the alignment mark in circular pattern are illustrated herein for purposes of explanation, it will be appreciated that a vast assortment of other alignment marks could also be used, and the present disclosure is in no way limited to the alignment mark in circular pattern. Other possible alignment pattern designs, such as in cross shape, L-shape, bullseye shape, a diamond shape, or the like, may be adopted in accordance with some embodiments.

In some embodiments, the carrier alignment mark 132 may be made of conductive material. In some embodiments, the carrier alignment mark 132 is a dummy structure which is electrically decoupled or electrically isolated from the carrier 130. In other embodiments, the carrier alignment mark 132 may be made of a non-conductive material, such as an insulating material, including a dielectric, or a polymer, such as PBO, an epoxy, BCB, polyimide, or a polyimide derivative, or the like. The alignment mark should be visibly different from the carrier 130, such that a visible difference can be distinguished between the alignment mark and the carrier 130 when viewed from the top side. The carrier alignment mark 132 may be an embedded alignment mark illustrated as being embedded in the carrier 130 in accordance with some embodiments. The embedded alignment mark is formed by making recesses or openings in the carrier 130. Such recesses may be formed to embed the alignment pattern into the carrier 130. The recesses may be formed, for example, by grating, carving, etching, etc.

In some examples, the upper imaging device 122 is moved above the carrier 130 and may capture an image of the carrier 130. In some embodiments, the image may be a digitized image of the carrier alignment mark 132 of the carrier 130. The image is obtained by radiating or scanning the transfer mechanism 120 with the light source 1222 and determining an image (e.g., based on reflection of the radiation). The scan may include an optical scan of an optically readable target (e.g. the carrier alignment mark 132) on the carrier. The image of the carrier alignment mark 132 provided by the upper imaging device 122 provides data useful to determine a carrier offset between a target (predetermined) position and an actual position of the carrier 130.

In some embodiments, for calibration of the carrier 130, the upper imaging device 122 can form an image of the carrier 130 (e.g., the carrier alignment mark 132). The image can be processed to derive X, Y, Z shift and/or rotation angle specifications for the carrier 130. From the image, an actual pitch (distance) and/or actual angle from the carrier 130 to the reference point (e.g., location of the lower imaging device 110) may be determined based on the actual position of the carrier 130. Accordingly, by comparing the target position and the actual position of the carrier 130 with respect to the reference point, an offset compensation algorithm may be performed to determine the offset value for compensating the shifts of the carrier 130 in the workpiece handling system.

In the present embodiment, for example, to determine whether the carrier 130 is offset (shifted) from the target position in the target offset map, the transfer mechanism 120 is moved to align the upper imaging device 122 with the carrier 130. Then, calculations and measurements can be made to determine a distance between the carrier at the actual location and the lower imaging device 110 (e.g., the reference point). Then, a carrier offset, if any, may be determined by calculating the difference between the actual position of the carrier alignment mark 132 and the target position with respect to the reference point.

It is noted that a zero carrier offset means that the actual position of the carrier alignment mark 132 matches the target position of the carrier alignment mark. If the difference between target position of the carrier alignment mark and the actual position of the carrier alignment mark 132 does not substantially equal to zero (e.g., greater than a predetermined value), it means that the carrier 130 has been shifted from the target position and adjustment is applied to compensate for the shift.

Figure 8:
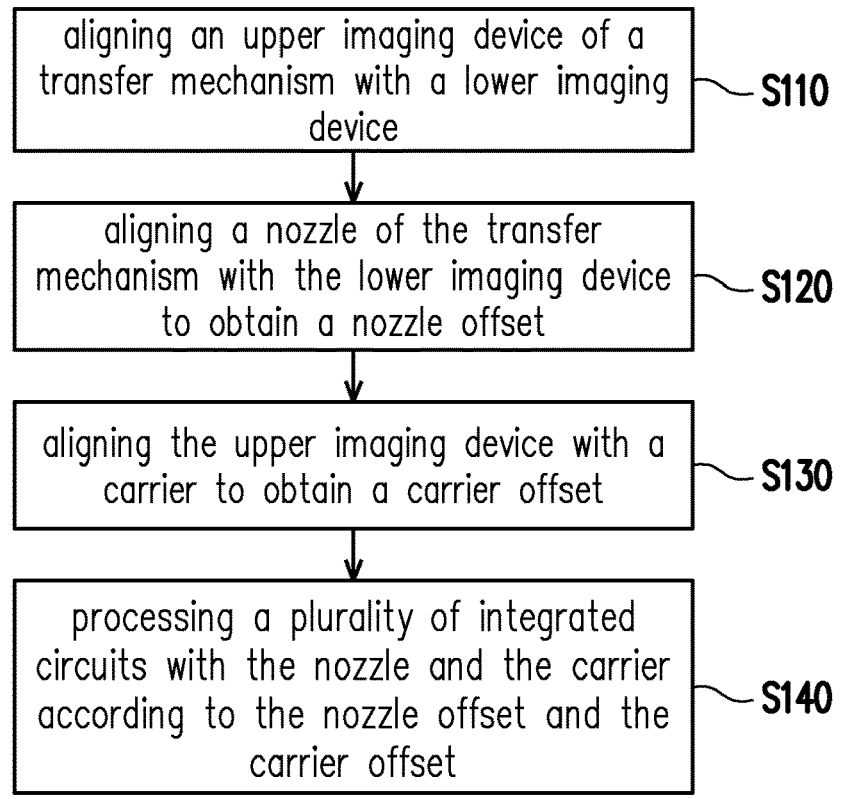
FIG. 8 illustrates a flow chart of intermediate stages in the manufacturing of a semiconductor package according to some embodiments of the present disclosure.

FIG. 8 illustrates a flow chart of intermediate stages in the manufacturing of a semiconductor package according to some embodiments of the present disclosure. Accordingly, the workpiece handling system in the disclosure may be incorporated into a clean room (e.g., Fab) for manufacturing a semiconductor package, so as to align and collimate apparatuses of the cleanroom before and/or during the manufacturing process. According to some embodiments, calibration of the system is initialized by initiating a calibration routine between the carrier 130 and the transfer mechanism 120 by the lower imaging device 110 and the upper imaging device 122. Referring to FIG. 1 and FIG. 8, in some embodiments, the method begins at step S110 where the upper imaging device 122 of the transfer mechanism 120 is aligned with the lower imaging device 110 to obtain a reference point. The transfer mechanism 120 is movably disposed over the lower imaging device 110. In some implementations, the lower imaging device 110 is fixed to a reference position in the system and the transfer mechanism 120 is moved relatively to the lower imaging device 110 for picking up the workpiece 200 from carrier and/or placing the workpiece 200 on carrier.

In some embodiments, the lower imaging device 110 may include a calibration plate 112 having a plate alignment mark 114. In some embodiments, the calibration plate 112 may be a calibration glass, or the like. Accordingly, for initial calibration, the transfer mechanism 120 is configured to be moved to the top of the lower the imaging device 110 to align the upper imaging device 122 with the plate alignment mark 114 of the lower imaging device 110 to obtain a reference point (e.g., origin point) in the system. For example, the light source of the upper imaging device 122 may emit a light beam as optical reference, and the transfer mechanism 120 is moved above the lower the imaging device 110 to align the light beam from the upper imaging device 122 over the plate alignment mark 114 of the lower imaging device 110. Generally, a reference point may be associated with a particular fixed location, such as a point location, that may have some physical significance and can be defined. In such cases, additional information may be provided to pinpoint the location associated with the reference point precisely. In the present embodiment, the reference point may be set to be the location of the plate alignment mark 114 on the lower imaging device 110 and/or the location of the upper imaging device 120 aligning with the lower imaging device 110. Other apparatuses such as the carrier 130 and the end effector 124 in the system can be located according to the reference point.

With now reference to FIG. 2 and FIG. 8, once the upper imaging device 122 is aligned with the lower imaging device 110, the method then proceeds to step S120 where the transfer mechanism 120 is moved to align the end effector 124 of the transfer mechanism 120 with the lower imaging device 110 to obtain an end effector offset. For example, the lower imaging device 110 may capture an image of the end effector 124 when the end effector 124 is moved to a location that is within a field of view of the lower imaging device 110. In some embodiments, the image may be a digitized image of a center of the end effector 124 such as an opening of the nozzle 124. The image of the end effector 124 provided by the lower imaging device 110 provides data useful to determine the end effector offset OS1 between a target (predetermined) position (illustrate in dotted line in FIG. 2) of the end effector 124' and an actual position (illustrated in solid line in FIG. 2) of the end effector 124. The embodiment shown in FIG. 2 illustrates the end effector offset OS1 in, for example, X direction. However, the same method can be used to determine the end effector offset in the Y direction, for example, and/or skew or rotation of the end effector 124 from the target position. If the difference between target position of the end effector 124' and the actual position of the end effector 124 does not substantially equal to zero (e.g., greater than a predetermined value), which means the end effector 124 has been shifted from the target position, adjustment is applied to compensate for the shift during the subsequent manufacturing process.

With now reference to FIG. 3 and FIG. 8, in some embodiments, the method then proceeds to step S130 where the transfer mechanism 120 is moved to align the upper imaging device 122 with the carrier 130 to obtain a carrier offset according to the reference point (e.g., location of the lower imaging device 110). In some embodiments, the carrier 130 has a carrier alignment mark 132, and at least one slot 134 for receiving the at least one workpiece 200. Accordingly, the transfer mechanism 120 is configured to move to align the upper imaging device 122 with the carrier alignment mark 132 for carrier calibration.

In some examples, the upper imaging device 122 may capture an image of the carrier 130 when the upper imaging device 122 is moved to a position where the carrier 130 is within a field of view of the upper imaging device 122. In some embodiments, the image may be a digitized image of the carrier alignment mark 132 of the carrier 130. The image of the carrier alignment mark 132 provided by the upper imaging device 122 provides data useful to determine a carrier offset between a target (predetermined) position and an actual position of the carrier 130.

In some embodiments, for calibration of the carrier 130, the image of the carrier captured by the upper imaging device 122 can be processed to derive X, Y, Z shift and/or rotation angle specifications for the carrier 130. From the image, an actual pitch (distance) and/or actual angle from the carrier 130 to the reference point (e.g., location of the lower imaging device 110) may be determined based on the actual position of the carrier 130. Accordingly, by comparing the target position and the actual position of the carrier 130 with respect to the reference point, an offset compensation algorithm may be performed to determine the offset value for compensating the shifts of the carrier 130 during subsequent manufacturing process. If the difference between target position of the carrier alignment mark and the actual position of the carrier alignment mark 132 does not substantially equal to zero (e.g., greater than a predetermined value), it means that the carrier 130 has been shifted from the target position and adjustment is applied to compensate for the shift during subsequent manufacturing processes.

Once the end effector offset and the carrier offset are obtained, the method then proceeds to step S140 where the workpiece 200 may be processed with the end effector 124 and the carrier 130 according to the nozzle offset and the carrier offset. In some embodiments, the workpiece 200 herein may include a whole wafer, a partial wafer (e.g., a die), a package, or other types of whole or partial objects or components having one or more planar surface areas upon which a set of inspection processes, testing processes and/or other processing operations may be applied. In the present embodiment, the workpiece may be a plurality of integrated circuits or semiconductor packages after the singularization process, but the disclosure is not limited thereto.

In an illustrative embodiment, the data such as end effector offset and carrier offset is obtained from the lower imaging device 110 and the upper imaging device 122 to identify apparatus (e.g., the end effector 124 and/or the carrier 130) shift if the offset does not substantially equal to zero (e.g., greater than a predetermined value). An offset compensation may thereafter be performed to collimate the apparatus shift. The offset compensation includes performing real-time compensation according to the nozzle offset and the carrier offset determined from the previous steps. For example, if no apparatus shift occurs (e.g., end effector offset and carrier offset are about equal to zero), the integrated circuits 200 are processed in original settings without any offset compensation. If apparatus shift occurs (e.g., end effector offset and/or carrier offset are not equal to zero), a determination may be made as to whether offset compensation is applied based on any definition (e.g., absolute value of the end effector offset and/or carrier offset are greater than or equal to a predetermined value) specified by engineers or users. In case that an offset compensation should be applied, offset compensation at step S140 is performed to correct the shifts of the end effector 124 and/or the carrier 130.

In some embodiments, for offset compensation of the end effector 124, a determination is made as to whether the end effector offset (e.g., difference between the actual position and the target position of the end effector 124) is greater than zero. A difference greater than zero means that the end effector 124 has been shifted toward a positive direction (e.g., shifted to the right) and adjustment is needed. The difference itself indicates the offset value for compensating the end effector shifts. Accordingly, the transfer mechanism 120 configured to transfer the integrated circuit 200 is automatically shifted in the opposite direction (e.g., shifted to the left) by the difference to pick up or place the integrated circuits 200 by the end effector 124 in the actual position. On the contrary, if the end effector offset (e.g., difference between the actual position and the target position of the end effector 124) is not greater than zero, a determination is made as to whether the difference between the actual position and the target position of the end effector 124 is less than zero. A difference less than zero also means that the end effector 124 has been shifted toward a negative direction (e.g., shifted to the left) and adjustment is needed. The difference itself indicates the offset value for compensating the end effector shift. Accordingly, the transfer mechanism 120 is automatically shifted in the opposite direction (e.g., shifted to the left) by the difference. However, if the difference between the actual position and the target position of the end effector 124 is not less than zero, no adjustment is made because no difference between target and actual position means that no end effector shift occurs.

Similarly, for offset compensation of the carrier 130, For example, a determination is made as to whether the carrier offset (e.g., difference between the actual position and the target position of the carrier 130) is greater than zero. If so, the transfer mechanism 120 configured to transfer the integrated circuit 200 is automatically shifted by the difference accordingly to place or pick up the integrated circuits 200 from the actual position of the carrier 130. On the contrary, if the carrier offset (e.g., difference between the actual position and the target position of the carrier 130) is less than zero, the transfer mechanism 120 is automatically shifted by the difference accordingly. However, if the difference between the actual position and the target position of the carrier 130 is not less than zero, no adjustment is made because no difference between target and actual position means that no carrier shift occurs. Accordingly, during the manufacturing process of the integrated circuit 200, the end effector 124 may be moved to pick up the integrated circuits 200 according to the end effector offset and/or the carrier offset, and the integrated circuits 200 may be placed onto the carrier 130 by the end effector 124 according to the end effector offset and/or the carrier offset.

FIG. 9 illustrates a schematic plane view of a workpiece handling system according to some embodiments of the present disclosure. It is noted that FIG. 9 merely illustrate one of the possible layouts for a clean room that incorporates the workpiece handling system therein. The disclosure is not limited thereto, and other layout may also be adopted. Referring to FIG. 1 to FIG. 3 and FIG. 9, the workpiece handling system 10 may include at least one load port 150 such that the carrier 130 with integrated circuits 200 disposed thereon may be placed within the load port 150 to be moved by the transfer mechanism 120.

In the present embodiment, the carrier 130 may include a first carrier 130a/130c and a second carrier 130b/130d. The end effector 124 is configured to pick up the integrated circuits 200 one by one from the first carrier 130a or 130c and place the integrated circuits 200 one by one onto the second carrier 130b or 130d. In detail, the clean room may include two sets of the workpiece handling systems 10, 10' for transporting the integrated circuits 200 to different work stations. The workpiece handling system 10 include the first carrier 130a and the second carrier 130b, and the end effector 124 is configured to pick up the integrated circuits 200 one by one from the first carrier 130a and place the integrated circuits 200 one by one onto the second carrier 130b for inspection. After the inspection is done, the end effector 124' is configured to pick up the integrated circuits 200 one by one from the first carrier 130c and place the integrated circuits 200 one by one onto the second carrier 130d for sorting and outputting the integrated circuits 200.

For the workpiece handling system 10, in some embodiments, after the integrated circuits 200 are sawed and singulated out from a wafer, each of the integrated circuits 200 may be undergone an inspection. The transport mechanism 120 may then transport the singulated integrated circuits 200 one by one from the first carrier 130a to the second carrier 130b, which may be a shuttle to an inspection station 300 for inspecting each of the integrated circuits 200. However, the disclosure is not limited thereto, the station 300 may also be any suitable process chamber for further processing the integrated circuits 200. For some station 300 that requires high temperature environment, the first carrier 130a may include a hot plate, or the like, for pre-heating the integrated circuits 200 before they are loaded into the station 300. The lower imaging device 110 may be disposed beside the carrier 130. In the present embodiments, the lower imaging device 110 is disposed between a plurality of second carrier 130b. The carrier alignment marks 132a, 132b may be disposed on the first carrier 130a and the second carrier 130b respectively for aligning and calibration process described above.

Figure 10:
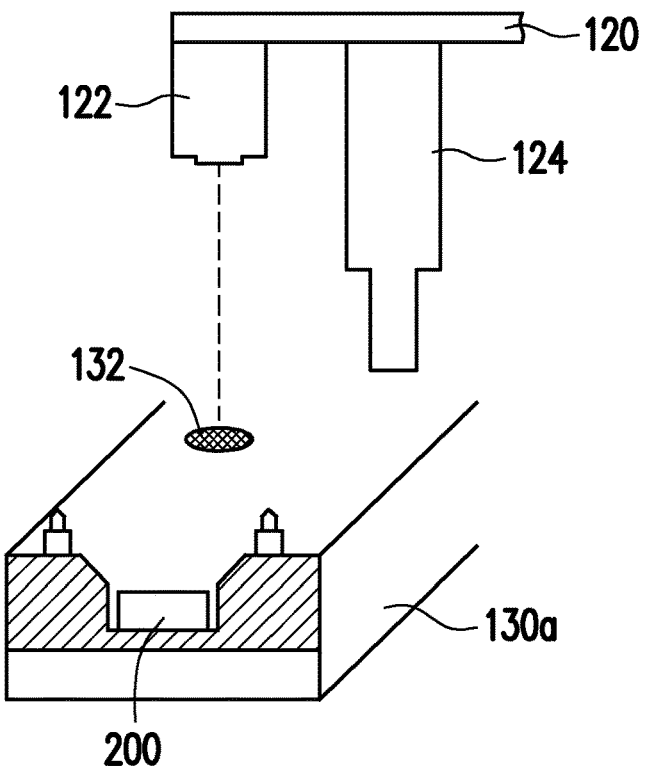
FIG. 10 to FIG. 11 illustrate schematic side views of a workpiece handling system in different operation scenarios according to some embodiments of the present disclosure.
Figure 11:
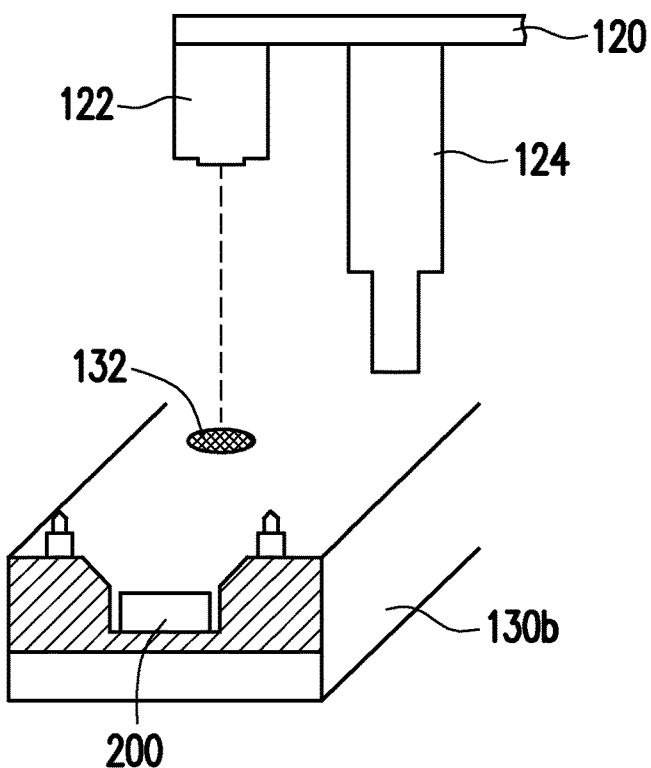

FIG. 10 to FIG. 11 illustrate schematic side views of a workpiece handling system in different operation scenarios according to some embodiments of the present disclosure. Referring to FIG. 9 to FIG. 11, in some embodiments, for calibration of the first carrier 130a and the second carrier 130b, the transfer mechanism 120 is moved to align the upper imaging device 122 with the first carrier 130a to obtain a first carrier offset. In no particular order, the transfer mechanism 120 is moved to align the upper imaging device 122 with the second carrier 130b to obtain a second carrier offset. The upper imaging device 122 may capture images of the first carrier 130a and the second carrier 130b, and the images can be processed to derive X, Y, Z shift and/or rotation angle specifications for the first carrier 130a and the second carrier 130b. From the image, an actual distance and/or actual angle from the first carrier 130a and the second carrier 130b with respect to a reference point (e.g., location of the lower imaging device 110) may be determined. Accordingly, by comparing the target positions and the actual positions of the first carrier 130a and the second carrier 130b with respect to the reference point, an offset compensation may be performed to determine the offset value for compensating the shifts of the first carrier 130a and the second carrier 130b respectively during subsequent manufacturing process. For example, the transfer mechanism 120 picks up the integrated circuits 200 from the first carrier 130a by the end effector 124 according to the end effector offset and the first carrier offset, and places the integrated circuits 200 onto the second carrier 130b according to the end effector offset and the second carrier offset.

Similarly, for the workpiece handling system 10', in some embodiments, after the integrated circuits 200 are inspected or processed by the station 300, the transport mechanism 120' may then transport the integrated circuits 200 one by one from the first carrier 130c to the second carrier 130d for unloading the integrated circuits 200 from the station 300. In the embodiment of the station 300 being the inspection station, the quantity of the second carrier 130d may be plural for sorting out the integrated circuits 200 for different inspection results. For example, some of the second carriers 130d may be pass target carriers for receiving the integrated circuits 200 that pass the inspection (i.e. good dies), and the rest of the second carriers 130d may be fail carriers for receiving the integrated circuits 200 that fail the inspection (i.e. bad dies). However, the disclosure is not limited thereto, the station 300 may also be any suitable process chamber for further processing the integrated circuits 200. The calibration of the first carrier 130c and the second carrier 130d may be the same or at least similar to the calibration of the first carrier 130a and the second carrier 130b described above. For purpose of clarity and simplicity, detail description of same or similar calibration method may be omitted.

Figure 12:
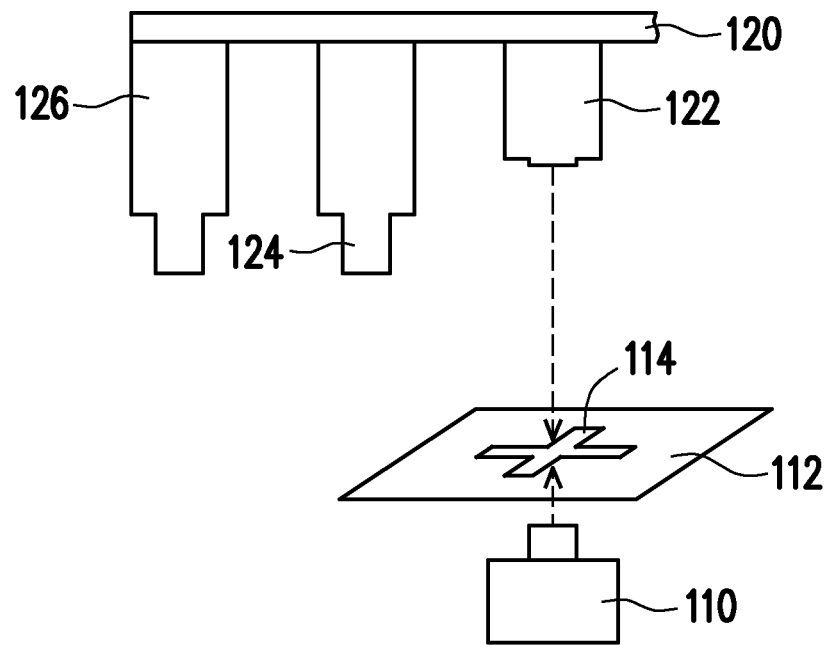
FIG. 12 to FIG. 14 illustrate schematic side views of a workpiece handling system in different operation scenarios according to some embodiments of the present disclosure.
Figure 13:
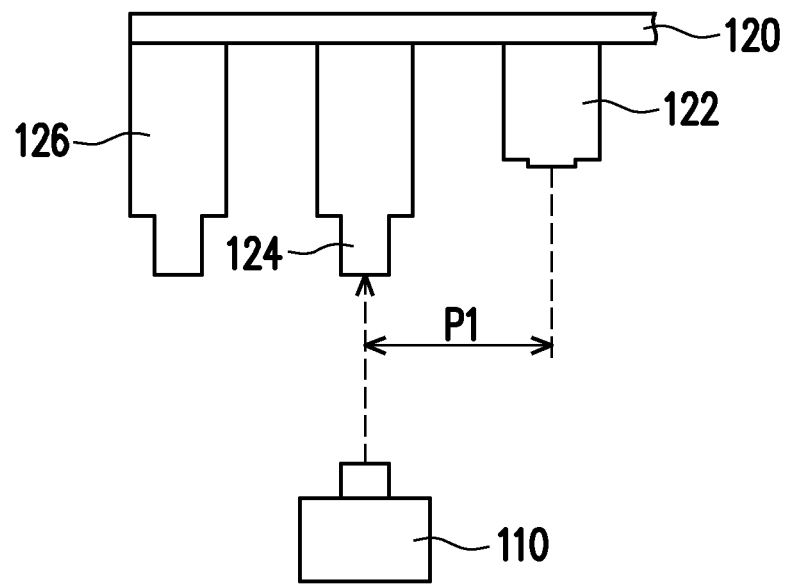
Figure 14:
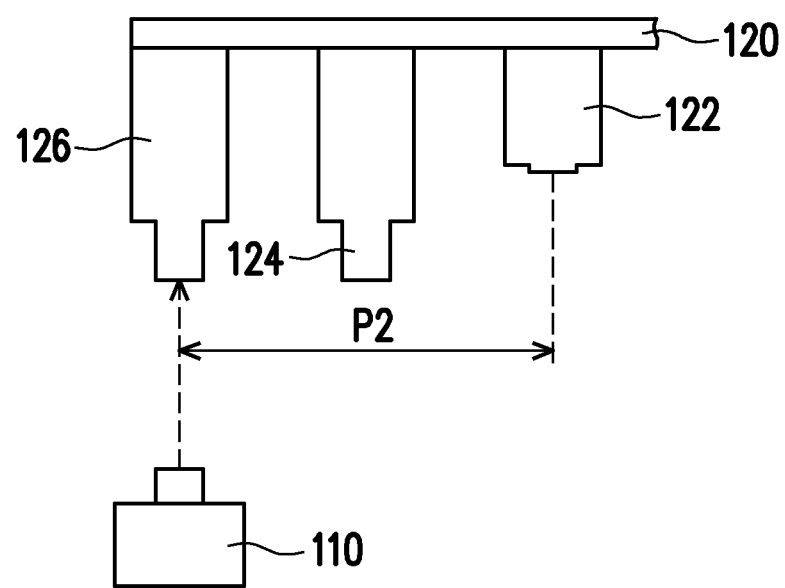

FIG. 12 to FIG. 14 illustrate schematic side views of a workpiece handling system in different operation scenarios according to some embodiments of the present disclosure. It is noted that the workpiece handling system shown in FIG. 12 to FIG. 14 contains many features same as or similar to the workpiece handling system disclosed in the previous embodiments. For purpose of clarity and simplicity, detail description of same or similar features may be omitted, and the same or similar reference numbers denote the same or like components. The main differences between the workpiece handling system shown in FIG. 12 to FIG. 14 and the workpiece handling system disclosed in the previous embodiments are described as follows.

With now reference to FIG. 12, in some embodiments, the transfer mechanism 120 may include a plurality of end effectors 124, 126 for picking up or placing a plurality of integrated circuits at the same time. Accordingly, the transfer mechanism 120 is capable of handling multiple integrated circuits in one operation. The capacity of the transfer mechanism 120 for handling the integrated circuits at once may be the same as the quantity of the end effectors 124, 126. For such workpiece handling system, the calibration method may include the following steps. In some embodiments, the transfer mechanism 120 is moved to align the upper imaging device 122 with the lower imaging device 110 to obtain (set) a reference point in the system. The transfer mechanism 120 is movably disposed over the lower imaging device 110. In some implementations, the lower imaging device 110 is fixed to a reference position in the system and the transfer mechanism 120 is moved relatively to the lower imaging device 110 for picking up the a plurality of integrated circuits from carrier 130 and/or placing the integrated circuits on carrier.

In some embodiments, the lower imaging device 110 may include the calibration plate 112 having the plate alignment mark 114. Accordingly, for initial calibration, the transfer mechanism 120 is configured to be moved to the top of the lower the imaging device 110 to align the upper imaging device 122 with the plate alignment mark 114 of the lower imaging device 110 to obtain the reference point (e.g., origin point) in the system. In the present embodiment, the reference point is set to be the location of the plate alignment mark 114 on the lower imaging device 110 and/or the location of the upper imaging device 120 aligning with the lower imaging device 110. Other apparatuses such as the carrier 130 and the end effectors 124, 126 in the system can be located according to the reference point.

With now reference to FIG. 13, once the upper imaging device 122 is aligned with the lower imaging device 110, the transfer mechanism 120 is then moved to align the (first) end effector 124 of the transfer mechanism 120 with the lower imaging device 110 to obtain an (first) end effector offset. For example, the lower imaging device 110 may capture an image of the end effector 124 when the end effector 124 is moved to a location that is within a field of view of the lower imaging device 110. In some embodiments, the image may be a digitized image of a center of the end effector 124. The image of the end effector 124 provided by the lower imaging device 110 provides data useful to determine the end effector offset between a target (predetermined) position and an actual position of the end effector 124. For example, calculations and measurements can be made to determine a pitch P1 between the end effector 124 and the upper imaging device 122 (e.g., the reference point). Then, the end effector offset, if any, may be determined by calculating (comparing) the difference between the pitch P1 and a target pitch, which is the pitch between a target position of the end effector 124 and the upper imaging device 122 (e.g., the reference point). The embodiment shown in FIG. 13 illustrates the measurement of the pitch P1 of the end effector 124 in, for example, X direction, in order to determine the end effector offset in X direction. However, the same method can be used to determine the end effector offset in the Y direction, for example, and/or skew or rotation of the end effector 124 from the target position. If the difference between target position and the actual position of the end effector 124 does not substantially equal to zero (e.g., greater or less than a predetermined value), which means the end effector 124 has been shifted from the target position, adjustment is applied to compensate for the shift during the subsequent manufacturing process.

With now reference to FIG. 14, similarly, for calibration of the (second) end effector 126, the transfer mechanism 120 is moved to align the (second) end effector 126 of the transfer mechanism 120 with the lower imaging device 110 to obtain an (second) end effector offset. For example, the lower imaging device 110 may capture an image of the end effector 126 when the end effector 126 is moved to a location that is within a field of view of the lower imaging device 110. The image of the end effector 126 provided by the lower imaging device 110 provides data useful to determine the end effector offset between a target (predetermined) position and an actual position of the end effector 126. For example, calculations and measurements can be made to determine a pitch P2 between the end effector 126 and the upper imaging device 122 (e.g., the reference point). Then, the end effector offset, if any, may be determined by calculating (comparing) the difference between the pitch P2 and a target pitch, which is the pitch between a target position of the end effector 126 and the upper imaging device 122 (e.g., the reference point). The embodiment shown in FIG. 14 illustrates the measurement of the pitch P2 of the end effector 126 in, for example, X direction, in order to determine the end effector offset in X direction. However, the same method can be used to determine the end effector offset in the Y direction, for example, and/or skew or rotation of the end effector 126 from the target position. If the difference between target position and the actual position of the end effector 126 does not substantially equal to zero (e.g., greater or less than a predetermined value), which means the end effector 126 has been shifted from the target position, adjustment is applied to compensate for the shift during the subsequent manufacturing process.

In accordance with some embodiments of the disclosure, a workpiece handling system includes a carrier, a lower imaging device, and a transfer mechanism. The carrier is configured to carry at least one workpiece. The lower imaging device is disposed beside the carrier. The transfer mechanism is movably disposed over the lower imaging device and the carrier, wherein the transfer mechanism includes an end effector configured to pick and place the at least one workpiece and an upper imaging device disposed beside the end effector.

In accordance with some embodiments of the disclosure, a method of calibrating a workpiece handling system includes the following steps. A transfer mechanism is moved to align an upper imaging device of the transfer mechanism with a lower imaging device disposed under the transfer mechanism to obtain a reference point. The transfer mechanism is moved to align an end effector of the transfer mechanism with the lower imaging device to obtain an end effector offset according to the reference point, wherein the end effector is configured to pick up at least one workpiece. The transfer mechanism is moved to align the upper imaging device with a carrier configured to carry the at least one workpiece to obtain a carrier offset according to the reference point.

In accordance with some embodiments of the disclosure, a method of manufacturing a semiconductor package includes the following steps. An upper imaging device of a transfer mechanism is aligned with a lower imaging device to obtain a reference point. An end effector of the transfer mechanism is aligned with the lower imaging device to obtain an end effector offset. The upper imaging device is aligned with a carrier to obtain a carrier offset. A plurality of integrated circuits are processed with the end effector and the carrier according to the end effector offset and the carrier offset.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A workpiece handling system, comprising:
a carrier carrying at least one workpiece;
a lower imaging device disposed beside the carrier, wherein the lower imaging device comprises a calibration plate having a plate alignment mark; and
a transfer mechanism movably disposed over the lower imaging device and the carrier, wherein the transfer mechanism comprises an end effector configured to pick and place the at least one workpiece and an upper imaging device disposed beside the end effector.

2. The workpiece handling system as claimed in claim 1, wherein the transfer mechanism is configured to move to align the upper imaging device with the plate alignment mark of the lower imaging device for initial calibration.

3. The workpiece handling system as claimed in claim 1, wherein the lower imaging device further comprises a light source facing the calibration plate and a refractor disposed on a travel path of light from the light source.

4. The workpiece handling system as claimed in claim 1, wherein the lower imaging device is fixed to a reference position and the transfer mechanism moves relatively to the lower imaging device.

5. The workpiece handling system as claimed in claim 1, wherein the carrier having a carrier alignment mark, and the transfer mechanism is configured to move to align the upper imaging device with the carrier alignment mark for carrier calibration.

6. The workpiece handling system as claimed in claim 1, wherein the transfer mechanism is configured to move to align the end effector with the lower imaging device for end effector calibration.

7. The workpiece handling system as claimed in claim 1, wherein the carrier comprises a first carrier and a second carrier, the end effector is configured to pick up the at least one workpiece from the first carrier and place the at least one workpiece onto the second carrier.

8. The workpiece handling system as claimed in claim 7, wherein the second carrier comprises a plurality of second carriers, and the lower imaging device is disposed between the plurality of second carriers.

9. A method of calibrating a workpiece handling system, comprising:
    moving a transfer mechanism to align an upper imaging device of the transfer mechanism with a lower imaging device disposed under the transfer mechanism to obtain a reference point;
    moving the transfer mechanism to align an end effector of the transfer mechanism with the lower imaging device to obtain an end effector offset according to the reference point, wherein the end effector is configured to pick up at least one workpiece; and
    moving the transfer mechanism to align the upper imaging device with a carrier configured to carry the at least one workpiece to obtain a carrier offset according to the reference point.

10. The method of calibrating the workpiece handling system as claimed in claim 9, wherein the lower imaging device further comprises a calibration plate having a plate alignment mark, and the transfer mechanism is moved to align the upper imaging device with the plate alignment mark of the lower imaging device.

11. The method of calibrating the workpiece handling system as claimed in claim 9, wherein the carrier having a carrier alignment mark, and the transfer mechanism is moved to align the upper imaging device with the carrier alignment mark.

12. The method of calibrating the workpiece handling system as claimed in claim 9, wherein the end effector offset is obtained by comparing a target position and an actual position of the end effector with respect to the reference point.

13. The method of calibrating the workpiece handling system as claimed in claim 9, wherein the carrier offset is obtained by comparing a target position and an actual position of the carrier with respect to the reference point.

14. The method of calibrating the workpiece handling system as claimed in claim 9, wherein the carrier comprises a first carrier and a second carrier, and moving the transfer mechanism to align the upper imaging device with the carrier comprises:
    moving the transfer mechanism to align the upper imaging device with the first carrier to obtain a first carrier offset; and
    moving the transfer mechanism to align the upper imaging device with the second carrier to obtain a second carrier offset.

15. A method of manufacturing a semiconductor package, comprising:
    aligning an upper imaging device of a transfer mechanism with a lower imaging device to obtain a reference point;
    aligning an end effector of the transfer mechanism with the lower imaging device to obtain an end effector offset with respect to the reference point;
    aligning the upper imaging device with a carrier to obtain a carrier offset with respect to the reference point; and
    processing a plurality of integrated circuits with the end effector and the carrier according to the end effector offset and the carrier offset.

16. The method of manufacturing the semiconductor package as claimed in claim 15, wherein processing the plurality of integrated circuits with the end effector and the carrier comprises:
    picking up the plurality of integrated circuits by the end effector according to the end effector offset; and
    placing the plurality of integrated circuits onto the carrier by the end effector according to the end effector offset and the carrier offset.

17. The method of manufacturing the semiconductor package as claimed in claim 15, wherein the end effector offset is obtained by comparing a target position and an actual position of the end effector with respect to the reference point.

18. The method of manufacturing the semiconductor package as claimed in claim 15, wherein the carrier offset is obtained by comparing a target position and an actual position of the carrier with respect to the reference point.

19. The method of manufacturing the semiconductor package as claimed in claim 15, wherein the carrier comprises a first carrier and a second carrier, and aligning the upper imaging device with the carrier comprises:
    aligning the upper imaging device with the first carrier to obtain a first carrier offset; and
    aligning the upper imaging device with the second carrier to obtain a second carrier offset.

20. The method of manufacturing the semiconductor package as claimed in claim 19, wherein processing the plurality of integrated circuits comprises:
    picking up the plurality of integrated circuits from the first carrier by the end effector according to the end effector offset and the first carrier offset; and
    placing the plurality of integrated circuits onto the second carrier according to the end effector offset and the second carrier offset.

* * * * *